United States Patent
Kamiya

(10) Patent No.: US 7,515,001 B2
(45) Date of Patent: Apr. 7, 2009

(54) AC AMPLIFIER AND PIEZOELECTRIC VIBRATOR OSCILLATOR

(75) Inventor: Masaaki Kamiya, Chuo-ku (JP)

(73) Assignee: Interchip Corporation, Tokyo (JP)

( * ) Notice: Subject to any disclaimer, the term of this patent is extended or adjusted under 35 U.S.C. 154(b) by 125 days.

(21) Appl. No.: 11/517,024

(22) Filed: Sep. 7, 2006

(65) Prior Publication Data

US 2007/0063768 A1    Mar. 22, 2007

(30) Foreign Application Priority Data

Sep. 8, 2005    (JP)    ............... 2005-260161

(51) Int. Cl.
*H03G 3/30*    (2006.01)

(52) U.S. Cl. ........................ 330/285; 330/136

(58) Field of Classification Search ................ 330/136; 333/187

See application file for complete search history.

(56) References Cited

U.S. PATENT DOCUMENTS 7,064,607 B2 *    6/2006    Maclean et al. ............. 330/136
2006/0176128 A1 *    8/2006    Matsuyama et al. ......... 333/187

FOREIGN PATENT DOCUMENTS

JP    61-17406 B2    5/1986

* cited by examiner

*Primary Examiner*—Steven J Mottola
(74) *Attorney, Agent, or Firm*—The Web Law Firm

(57) ABSTRACT

An AC amplifier has an amplification circuit, and a bias circuit connected together by connecting wiring. The bias circuit receives an input of an AC signal from the amplification circuit via the connecting wiring. A DC voltage of the bias circuit conformed to the amplitude of the AC signal of the amplification circuit is supplied to the amplification circuit via the connecting wiring.

17 Claims, 7 Drawing Sheets

PRIOR ART

PRIOR ART

PRIOR ART

AC AMPLIFIER AND PIEZOELECTRIC VIBRATOR OSCILLATOR

The entire disclosure of Japanese Patent Application No. 2005-260161 filed Sep. 8, 2005 is expressly incorporated by reference herein.

BACKGROUND OF THE INVENTION

1. Field of the Invention

This invention relates to an AC amplifier. More particularly, the invention relates to an AC amplifier which is useful when applied as an AC amplifier of the CMOS type composed of a PMOS transistor and an NMOS transistor.

2. Description of the Related Art

FIG. 9 is a circuit diagram showing a basic AC, amplifier of the CMOS type. In this AC amplifier, as shown in this drawing, a PMOS transistor T1 and an NMOS transistor T2 are connected in series. Both gates of transistors T1 and T2 are connected together and used as an input terminal IN, while both drains of transistors T1 and T2 are connected as an output terminal OUT. A feedback resistance Rf1 is connected between the input terminal IN and the output terminal OUT to constitute a self-bias circuit.

In order to decrease minimum operating voltage VDDmin in the above-described AC amplifier, it is necessary to decrease both of the threshold voltage Vtp of the PMOS transistor T1 and the threshold voltage Vtn of the NMOS transistor T2. Since n-type polysilicon is use as gate electrode in an ordinary MOS transistor, if the threshold voltage Vtp of the PMOS transistor is 0.4V or less, the off-state leakage current of the PMOS transistor sharply increases. Generally IC's of low-voltage operation are demanded low current consumption, and the use of a device involving a large off-state leakage current is not a right choice.

The threshold voltage Vtn of the NMOS transistor can be decreased to 0.35V. However, it is still difficult to decrease the minimum operating voltage VDDmin to 1.0V or less.

In an AC amplifier used for a crystal oscillator, for example, there is a growing demand for decreasing the minimum operating voltage VDDmin without sacrificing the amplification factor A of the amplifier. Concretely, demand is surging for the advent of an AC amplifier having a minimum operating voltage VDDmin of 1.0V or less.

An AC amplifier shown in FIG. 10 can achieve a low voltage operation without lowering the threshold voltage of MOS transistors, and has a required amplification factor A.

In the AC amplifier shown in FIG. 10, the gate of its PMOS transistor T1 is biased by a bias resistance Rb and a reference voltage source VB1. The bias voltage Vb1 of the reference voltage source VB1 is set to be greater by an excess voltage Xp than the threshold voltage Vtp of the PMOS transistor T1. Hereinbelow, the bias voltage Vb1 is expressed as Vtp+Xp.

In this AC amplifier, a capacitor Cc1 is inserted between the gate of the PMOS transistor T1 and the gate of an NMOS transistor T2. Thus, different bias voltages can be applied to the respective gates, but both gates are short-circuited with respect to high frequency AC signal. The gate and drain of the NMOS transistor T2 are connected via a feedback resistance Rf1.

FIGS. 11A and 11B show voltage-current characteristics when the AC amplifier shown in FIG. 10 is operated at 0.9 V. FIG. 11A is a characteristic view showing the relation of a drain saturation current of the PMOS transistor T1 with respect to the gate voltage Vg and a drain saturation current of the NMOS transistor T2 (Vg is based on ground potential). The current curve L7 in FIG. 11A shows that a drain current Id1 can flow out from the PMOS transistor T1 when the bias voltage Vtp+Xp is applied to the gate of the PMOS transistor T1. The current curve L8 in FIGS. 11A and 11B shows the drain saturation current of the self-biased NMOS transistor T2 with respect to the output voltage Vout (Vg=Vout in self biased NMOS transistor T2).

With the AC amplifier of the basic structure shown in FIG. 9, at the operating point B1, the PMOS transistor T1 and the NMOS transistor T2 both act in their saturation region. Thus, in order for the AC amplifier of FIG. 10 to have the same amplification characteristic as the AC amplifier shown in FIG. 9 the PMOS transistor T1 and the NMOS transistor T2 both need to act in the saturation region. Here, the NMOS transistor T2 whose gate and drain are connected by the feedback resistance Rf1 has a gate-source voltage and a drain-source voltage identical with each other, and its threshold voltage Vtn is positive. Thus, the NMOS transistor T2 works always in the saturation region.

A characteristic curve L9 shown in FIG. 11B is a drain saturation current of the PMOS transistor T1. In order for the PMOS transistor T1 to act in the saturation region, the drain-source voltage of the PMOS transistor T1 has to be greater than a non-saturation region voltage Yp, as shown in FIG. 11B. Here, the non-saturation region voltage Yp is a drain voltage Vd necessary for the saturation of the drain current Id when the bias voltage (Vtp+Xp) is applied between the gate and the source of the PMOS transistor T1. Generally, the relation Yp≦Xp holds. Let the drain-source voltage of the NMOS transistor T2 be expressed as (Vtn+Xn) when a drain saturation current flows in the PMOS transistor T1. In this case, the drain-source voltage of the PMOS transistor T1 is expressed with Vdsp in FIG. 11A. Thus, the followings equation (1) holds:

$$VDD = Vdsp + (Vtn + Xn) \quad (1)$$

On the other hand, power supply voltage VDD, which permits the AC amplifier to perform a sufficient amplifying operation, is represented by the following equation (2) based on Vdsp≧Yp:

$$VDD \geq Vtn + Xn + Yp \quad (2)$$

Thus, the minimum operating voltage VDDmin of the AC amplifier is defined by (Vtp+Xp) or (Vtn+Xn+Yp), whichever is higher in value. That is, the minimum operating voltage VDDmin=MAX (Vtp+Xp, Vtn+Xn+Yp). If Vtp equals Vtn, and Xn equals Xp, then the minimum operating voltage VDDmin=Vtn+Xn+Yp. Here, a comparison will be made between the minimum operating voltage VDDmin of the AC amplifier shown in FIG. 9 and that of AC amplifier shown in FIG. 10. The comparison shows that the minimum operating voltage VDDmin of the AC amplifier shown in FIG. 10 can be decreased, at least, by a voltage corresponding to the threshold voltage Vtp of the PMOS transistor T1.

Japanese Patent publication No. 1986-17406 can be named as an example of related art which has the same idea as that of the AC amplifier shown in FIG. 10 and which can attain the same object as that of this AC amplifier. The AC amplifier shown in Japanese Patent publication No. 1986-17406 is equivalent to that of FIG. 10 in which the reference voltage source VB1 is put to zero and the bias resistance Rb is directly grounded.

It is not an exaggeration to say that a crystal, oscillator, which is a typical circuit utilizing an AC amplifier, is currently used for most of electronic equipment. Generally, the crystal oscillator needs a high amplification factor A at the start of oscillator thus requiring a large drain current Id1 at the operating point. In a stable oscillation state, on the other hand, a large current at the operating point results in a wasteful through current. This is a major problem from the viewpoint of low power consumption.

In FIG. 10, when an increasing AC signal of a cycle T as shown in FIG. 12 is given to its input terminal IN, a through current of the AC amplifier Id fluctuates as shown in FIG. 13. A line L4 in FIG. 13 represents a drain current Id1 when the gate of the PMOS transistor T1 is biased with Vb1 by the reference voltage source VB1. That is, the bias voltage on the gate of the PMOS transistor T1 is fixed, whereby the drain current Id1 at the operating point B1 as shown in FIG. 1A flows as a through current every half of the signal cycle T. Accordingly, with the AC amplifier concerned, the great drain current Id1 required for start of oscillation flows periodically, thus making it difficult to decrease the current consumption of the AC amplifier.

With the AC amplifier concerned, moreover, the operating point B1 greatly leans toward the power supply voltage VDD. Thus, the duty (the ratio of the time during which a waveform is at a high level to the cycle of the waveform) of the output AC signal greatly deviates compared with the input AC signal. To remove this deviation in duty, it is necessary to add a new correction circuit or the like.

The present invention has been accomplished in the light of the above-mentioned problems with the earlier technologies. It is an object of the present invention to provide an AC amplifier of low voltage and low current operation which minimizes a deviation in the duty of an output signal waveform, and has a sufficient amplification factor.

SUMMARY OF THE INVENTION

A first aspect of the present invention, for attaining the above object, is an AC amplifier, comprising: an amplification circuit; and a bias circuit, wherein the bias circuit generates a bias voltage conformed to an amplitude of an AC signal inputted into the amplification circuit, and the bias voltage controls an operating point of the amplification circuit.

A second aspect of the present invention is the AC amplifier according to the first aspect, wherein the AC signal is inputted into the bias circuit via connecting wiring, and the bias voltage generated bar the bias circuit is supplied to the amplification circuit via the connecting wiring.

A third aspect of the present invention is the AC amplifier according to the second aspect, wherein the amplification circuit has a first MOS transistor of a p- or n-type and a second MOS transistor of an n- or p-type having drains interconnected, the amplification circuit includes a first feedback resistance connected between the drain and a gate of the second MOS transistor, and a first coupling capacitor connected between a gate of the first MOS transistor and the gate of the second MOS transistor, the gate of the first MOS transistor is connected to the connecting wiring, the gate of the first or second MOS transistor is used as an input terminal for the signal to be amplified, and the interconnected drains of the first MOS transistor and the second MOS transistor are used as an output terminal for the amplified signal.

A fourth aspect of the present invention is the AC amplifier according to the second or third aspect, wherein the bias circuit includes a reference voltage source and a nonlinear resistance element interconnected, and an end of the nonlinear resistances element is connected to the connecting wiring.

A fifth aspect of the present invention is the AC amplifier according to the fourth aspect, wherein the nonlinear resistance element is connected to a power supply of the AC amplifier, instead of being connected to the reference voltage source, or the nonlinear resistance element is grounded without being mediated by the reference voltage source.

A sixth aspect of the present invention is the AC amplifier according to the fourth or fifth aspect, wherein the nonlinear resistance element is composed of a MOS transistor.

A seventh aspect of the present invention is the AC amplifier according to the sixth aspect, wherein the nonlinear resistance element is composed of a depletion MOS transistor.

An eighth aspect of the present invention is the AC amplifier according to the second or third aspect, wherein the bias circuit includes a third MOS transistor of a p- or n-type and a fourth MOS transistor of an n- or p-type having drains interconnected, a second feedback resistance connected between the drain and a gate of the third MOS transistor, a second coupling capacitor connected between the gate of the third MOS transistor and a gate of the fourth MOS transistor, and a reference voltage source giving a DC bias to the gate of the fourth MOS transistor via a bias resistance, and the gate of the third MOS transistor is connected to the connecting wiring.

A ninth aspect of the present invention is the AC amplifier according to the eighth aspect, wherein the nonlinear resistance element is connected to a power supply of the AC amplifier, instead of being connected to the reference voltage source, or the nonlinear resistance element is grounded without being mediated by the reference voltage source.

A tenth aspect of the present invention is a piezoelectric vibrator oscillator having the AC amplifier according to any one of the first to ninth aspects.

According to the present invention as described above, an AC amplifier can be easily achieved which acts at a low voltage and a reduced current consumption, without lowering the threshold voltage of the MOS transistors constituting the AC amplifier, and has a small deviation in the duty of the output signal waveform. The use of the AC amplifier according to the present invention makes it possible to provide a piezoelectric element oscillator, such as a crystal oscillator, which performs a stable oscillating operation with frequency of several tens of MHz, at a voltage of 1V or less, and with a low current consumption.

BRIEF DESCRIPTION OF THE DRAWINGS

For a more complete understanding of the present invention and the advantages thereof, reference is now made to the following descriptions in conjunction with the accompanying drawings.

FIG. 11A is the drain current characteristic L7 of the PMOS transistor T1 versus its gate voltage Vg and the drain current characteristic L8 of the NMOS transistor T2 versus its gate voltage Vg. FIG. 11B is the drain current characteristic L8 versus the output voltage Vout of the AC amplifier and the drain current L9 of the PMOS transistor T1 versus the output voltage Vout of the AC amplifier.

DESCRIPTION OF THE PREFERRED EMBODIMENTS

Embodiments of the present invention will now be described in detail with reference to the accompanying drawings. It goes without saying that the present invention is in no way limited to the following embodiments.

First Embodiment

Figure 1:
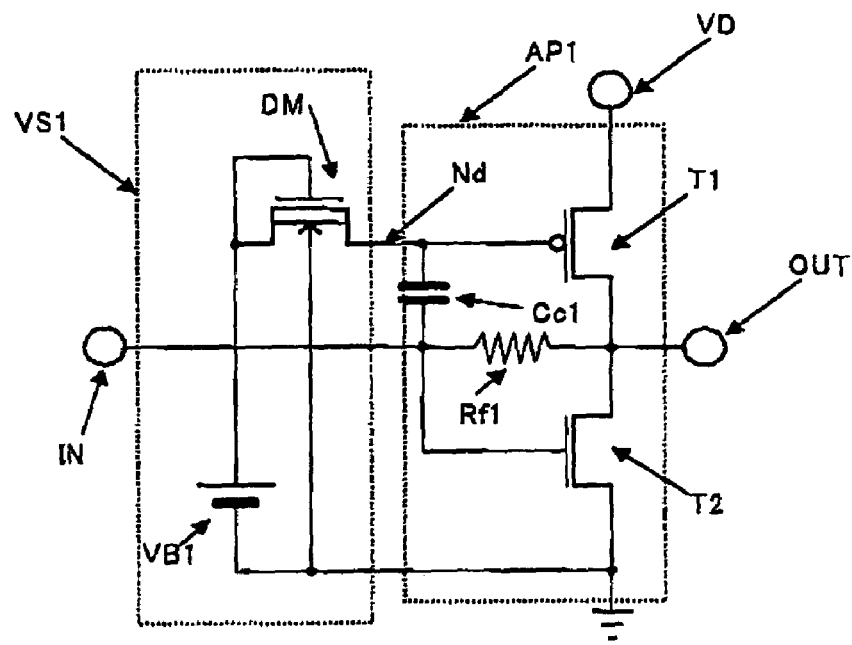
FIG. 1 is a circuit diagram showing an AC amplifier according to a first embodiment of the present invention.

As shown in FIG. 1, the AC amplifier according to the present embodiment is composed of an amplification circuit AP1, a bias circuit VS1, and connecting wiring Nd for transferring signals between both circuits AP1 and VS1. That is, this AC amplifier has the same structure as that of the AC amplifier according to the earlier technology shown in FIG. 10, except that the gate of a PMOS transistor T1 is connected to the bias circuit VS1. The connecting wiring Nd plays two roles, i.e., a role in transmitting an AC signal inputted into the amplification circuit AP1 to the bias circuit VS1, and a role in returning a bias voltage generated in the bias circuit VS1 to the amplification circuit AP1.

The bias circuit VS1 is composed of a reference voltage source VB1, and a depletion NMOS transistor DM as a non-linear resistance element. The gate and source of the depletion NMOS transistor DM are both connected to the reference voltage source VB1, and its drain is connected to the gate of PMOS transistor T1 via the connecting wiring Nd.

Figure 2:
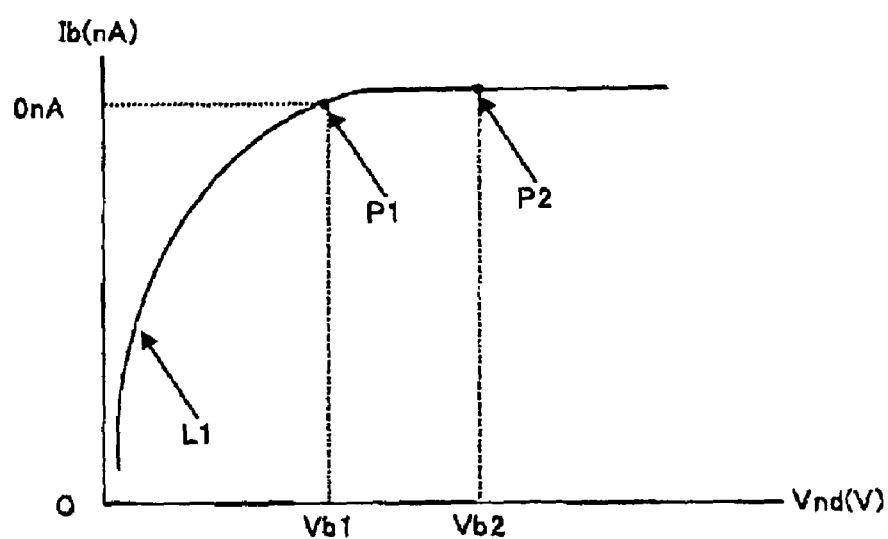
FIG. 2 is a characteristic view showing the voltage-current characteristics of a bias circuit VS1 of FIG. 1 viewed based on connecting wiring Nd.

Actions of the Bias Circuit VS1:

FIG. 2 shows the voltage-current characteristics of the bias circuit VS1 of FIG. 1 viewed from the connecting wiring Nd. Here, the current Ib takes a positive value if it flows from Nd into the bias circuit VS1. In the absence of the input AC signal in the amplification circuit AP1, the connecting wiring Nd, i.e., the gate of the PMOS transistor T1 is biases to the bias voltage Vb1 of the reference voltage source VB1.

Figure 3:
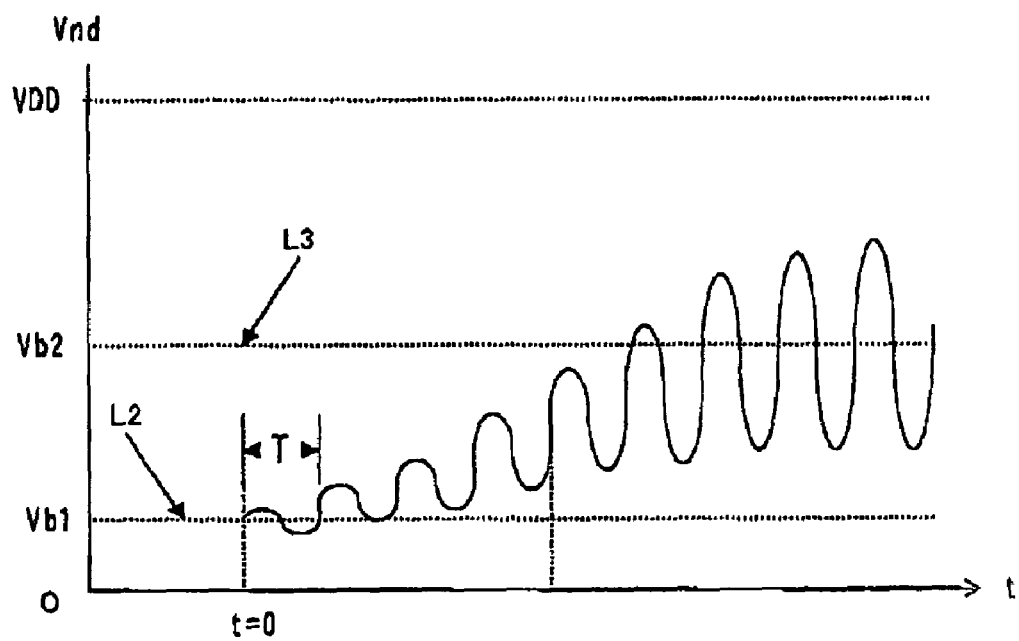
FIG. 3 is a characteristic view showing AC signals at the connecting wiring Nd of FIG. 1.
Figure 12:
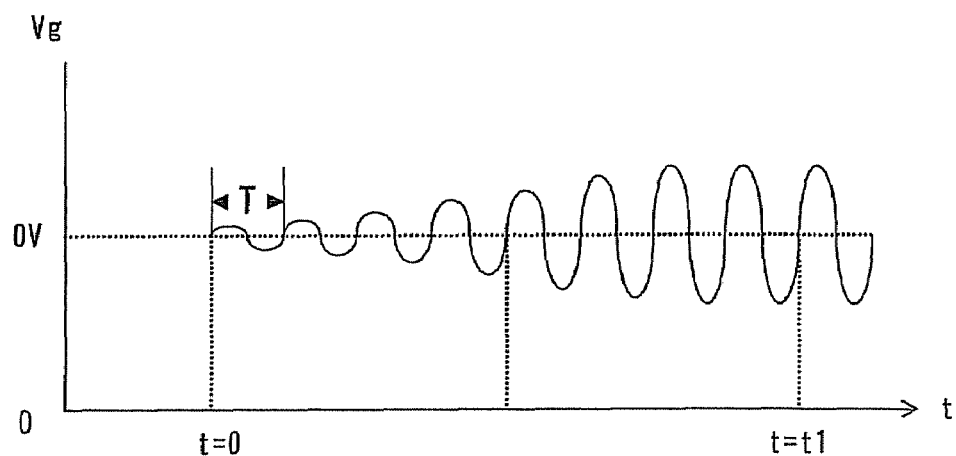
FIG. 12 is a waveform view showing AC input signals entered into the AC amplifier.
Figure 13:
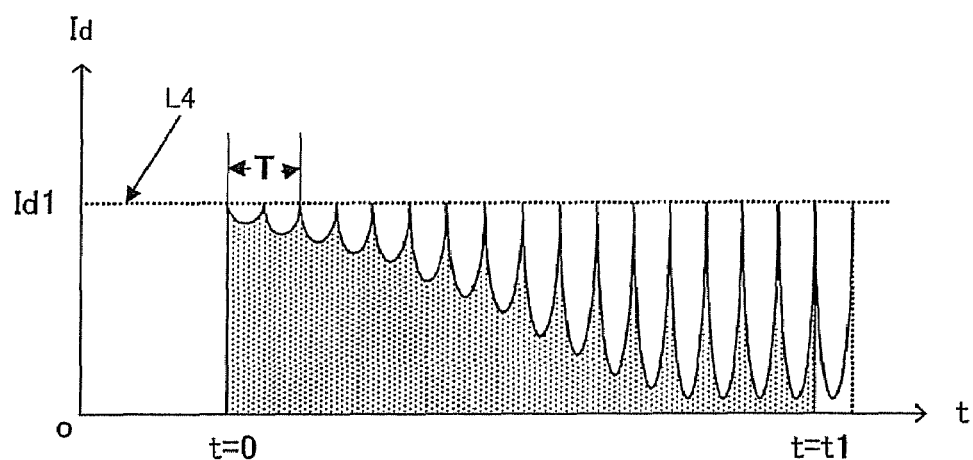
FIG. 13 is a through current waveform of the AC amplifier shown in FIG. 10 when AC signals shown in FIG. 12 is applied to the input of the AC amplifier.

When an input AC signal as shown in FIG. 12 is transmitted to the bias circuit VS1, for a small input AC signal in the beginning stage, the bias circuit VS1 acts as a linear circuit around its operating point P1. Next, the bias circuit action for a large input AC signal is described. When the voltage of the connecting wiring Nd is getting lower than Vb1 by certain amount, the current flowing out from the bias circuit VS1 becomes large. On the other hand, when the voltage of the connecting wiring Nd is getting higher than Vb1, a current flowing into the bias circuit VS1 remains small. Thus, the average voltage of the connecting wiring Nd increases from Vb1 at the first operating point Pi toward Vb2 at the next operating point P2, as shown in FIG. 3. In accordance with this trend, the gate bias voltage of the PMOS transistor T3 biased by the connecting wiring Nd becomes shallower. Thus, PMOS drain current is decreased.

Figure 10:
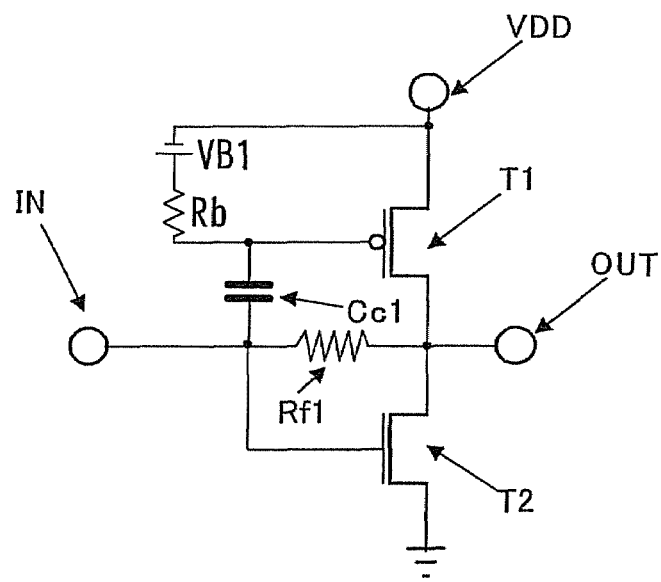
FIG. 10 is a circuit diagram showing another AC amplifier according to an earlier technology.
Figure 11A:
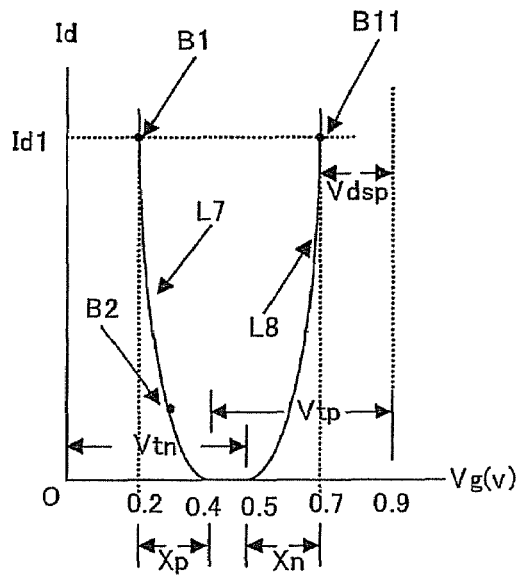
FIGS. 11A and 11B show the characteristics of the AC amplifier shown in FIG. 10.
Figure 11B:
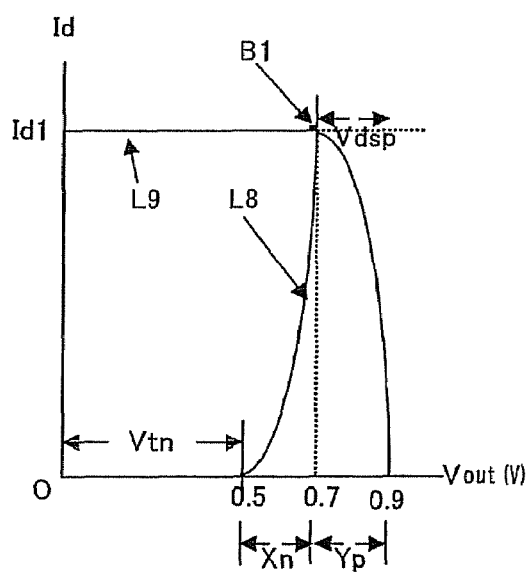

Actions of the Amplification Circuit AP1:

The amplification circuit AP1 has the same circuit configuration as that of the CMOS inverting amplifier according to the earlier technology shown in FIG. 10, except that the gate of the PMOS transistor T1 is biased via the connecting wiring Nd by the bias voltage from the bias circuit VS1. Hence, an explanation for the actions of the amplification circuit AP1 in the absence of input AC signals will be omitted.

If the input AC signal is applied to the amplification circuit AP1, the input AC signal is transmitted to the bias circuit VS1 via the connecting wiring Nd. The bias circuit VS1 returns a bias voltage, which is conformed to the amplitude of the input AC signal supplied from the input terminal IN, via the connecting wiring Nd. Thus, the gate bias voltage Vb of the PMOS transistor T1 changes from Vb1 in the absence of the input AC signal to Vb2. As the amplitude of the AC signal increases, the gate bias voltage Vb of the PMOS transistor T1 exceeds VDD-Vtp, and the PMOS transistor T1 changes to a Class B or Class C operation.

Figure 4:
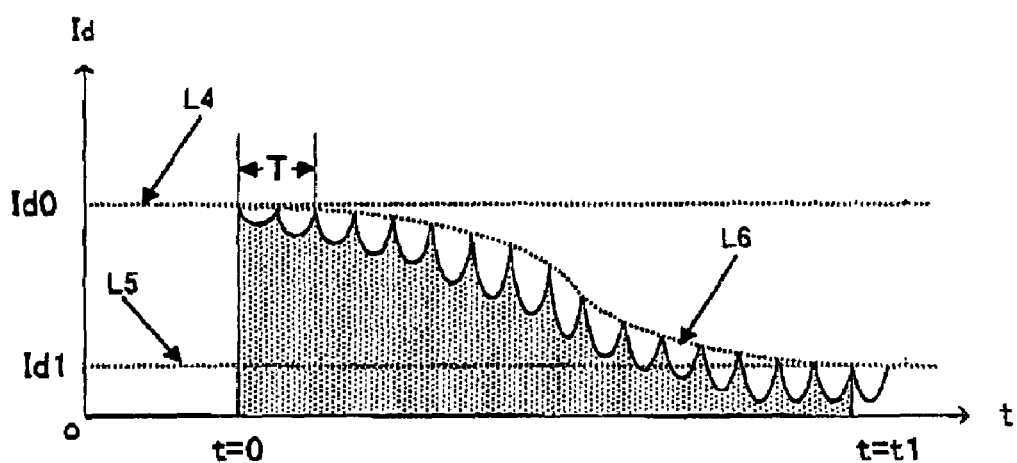
FIG. 4 is a current characteristic view of an amplification circuit AP according to the present embodiment.

At this time, the gate voltage of NMOS transistor T2 is biased by the average voltage of the output terminal OUT by the feedback resistor Rf1, so that its action also changes to a Class B or Class C. FIG. 1 shows a through current waveform when the input AC signal of FIG. 12 is given to the amplification circuit AP1 of FIG. 1. A characteristic curve L6 illustrates the trend of the through current varying according to the amplitude of the AC signal. A characteristic line L4 shows the drain current Id0 in the gate bias voltage Vb1 of the PMOS transistor T1 when there is no AC signal. A characteristic curve L5 shows the drain current Id1 when the AC signal grows and the gate bias voltage of the PMOS transistor T1 becomes Vb2. FIG. 4 shows a case where the drain current Id1 is not zero. As the AC signal further grows, however, the drain current Id1 approaches zero. According to the above-described AC amplifier of the present embodiment, as the AC signal grows, the through current flowing in the AC amplifier can be cut off completely. In addition, it is possible to bias both transistors T1 and T2 such that they are placed under nearly the same operating conditions. It is also easy to approach the duty of the output voltage Vout to ½.

Second Embodiment

Figure 5:
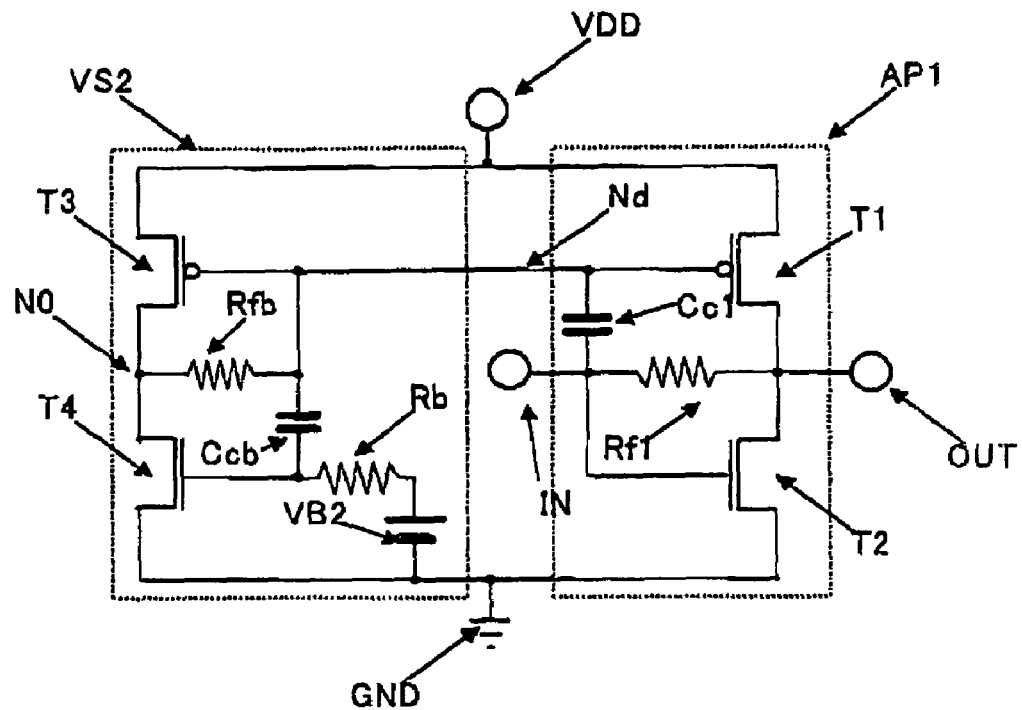
FIG. 5 is a circuit diagram showing an AC amplifier according to a second embodiment of the present invention.

FIG. 5 is a circuit diagram showing an AC amplifier according to the second embodiment of the present invention. As shown in the drawing, the AC amplifier according to the present embodiment has an amplification circuit AP1, and a bias circuit VS2. The amplification circuit AP1 has a similar configuration as that of the AC amplifier according to the aforementioned first embodiment, and the bias circuit VS2 has a configuration in which the AC amplifier of the earlier technology shown in FIG. 10 has been complementarily inverted. Connecting wiring Nd connects the gate of a PMOS transistor T1 of the amplification circuit AP1 to the gate of a PMOS transistor T3 of the bias circuit VS2, thus playing two roles, i.e., a role in transmitting an AC signal inputted into the amplification circuit AP1 to the bias circuit VS2, and a role in returning a bias voltage generated in the bias circuit VS2 to the amplification circuit AP1.

In the bias circuit VS2, the drain of the PMOS transistor T3 and the drain of the NMOS transistor T4 are connected together at a node No. Moreover, the PMOS transistor T3 is self-biased by a second feedback resistance Rfb connected between its gate and drain. The bias voltage of a reference voltage source VB2 is applied to the gate of the NMOS transistor T4 via a bias resistance Rb. Since the bias voltage of the reference voltage source VB2 is set at a greater voltage than the threshold voltage Vtn of the NMOS transistor T4, this bias voltage will hereinafter be expressed as Vtn+Xnb. The AC signal from the amplification circuit AP1 transmitted via the connecting wiring Nd is inputted into the gate of the PMOS transistor T3, and concurrently inputted into the gate of the NMOS transistor T4 via a second coupling capacitor Ccb inserted between the gates of both transistors.

Figure 6:
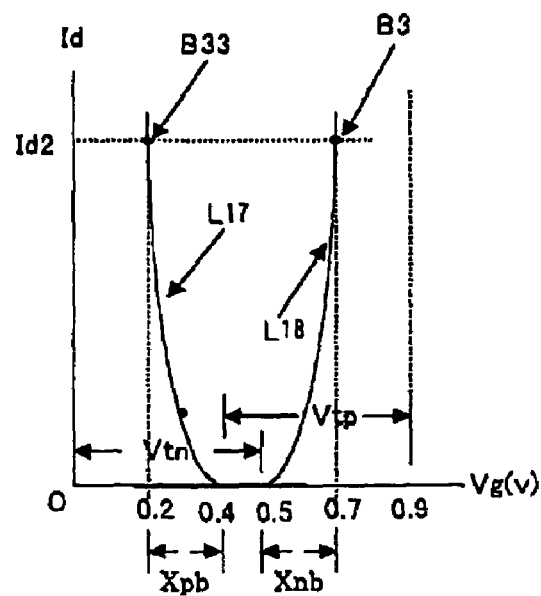
FIG. 6 is a characteristic view showing the drain current characteristics of the PMOS transistor T3 and the NMOS transistor T4 of a bias circuit VS2 shown in FIG. 5 with respect to its gate voltage Vg.

Actions of the Bias Circuit VS:

FIG. 6 is a characteristic view showing the relation of a drain saturation current of the PMOS transistor T3 with respect to the gate voltage Vg and a drain saturation current of the NMOS transistor T4 in the bias circuit VS2 of FIG. 5 (Vg is based on ground potential). The bias circuit VS2 acts in a manner complementary to the AC amplifier according to the earlier technology shown in FIG. 10. That is, the NMOS transistor T4 is biased to an operating point B3 by the bias voltage Vtn+Xnb applied to its gate, while the PMOS transistor T3 is biased to an operating point B33 by the drain current Id2 of the operating point B3. The gate-source voltage Vtp+Xpb of the PMOS transistor T3 at the operating point B33 becomes the bias voltage to be applied to the gate of the PMOS transistor T1 of the amplification circuit AP1.

Next, the actions of the bias circuit VS2 when the AC signal is transmitted from the amplification circuit AP, will be described. In response to a small AC signal, the bias circuit VS2 acts as a linear amplification circuit in the vicinity of its operating point. As the amplitude of the AC signal increases however, the PMOS transistor T3 repeats ON and OFF. If the amplitude of the input AC signal increases further, the NMOS transistor T4 as well repeats ON and OFF. In this manner, the average voltage at the node NO gradually approaches ½ of the power supply voltage VDD. Since the gate of the PMOS transistor T3 is connected to its drain via the feedback resistance Rfb, the gate voltage of the PMOS transistor T3 is self-biased by the average value of the drain-source voltage. That is, the gate bias voltage of the PMOS transistor T3 changes from the operating point B33 when there is no AC signal, and gradually approaches ½ of the power supply voltage VDD, responsive to the amplitude of the AC signal. The output load at the node NO of the bias circuit is the stray capacity of both transistors and Rfb designed to be high resistance, and is thus very light. Hence, it is easy to lower the driving capability of both transistors, thereby decreasing the current consumption in the bias circuit to a level negligibly low compared with the current consumption of the amplification circuit.

A comparison between the AC amplifier according to the present embodiment and the AC amplifier according to the aforementioned first embodiment shows that both act on the same principle, although the difference between the bias circuits VS2 and VS1 exists as stated earlier. That is, when the input AC signal entered into the amplification circuit AP1, the AC signal is transmitted to the bias circuit VS2 via the connecting wiring Nd; the bias circuit VS2 returns the bias voltage Vb, which is determined by the amplitude of the AC signal, to the gate of the PMOS transistor T1 of the amplification circuit AP1 via the connecting wiring Nd; and the amplification circuit AP1 has its operating point shifted by this bias voltage Vb, and acts as a low through current amplifier. In addition, it becomes possible to operate both transistors T1 and T2 under nearly the same bias conditions. This makes it easy to approach the duty of the output voltage Vout to ½.

Third Embodiment

Figure 7:
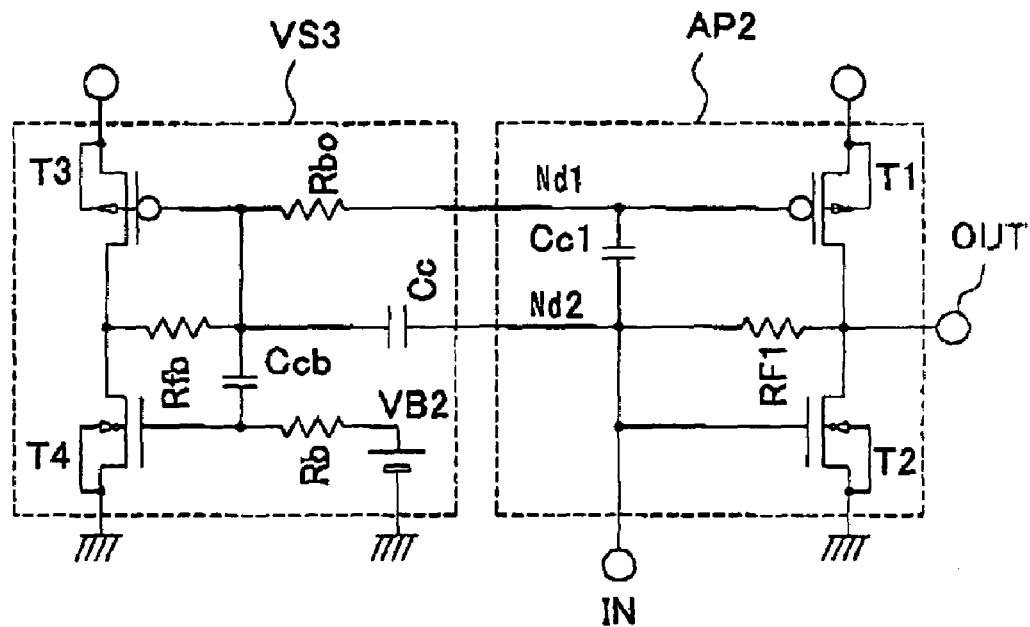
FIG. 7 is a circuit diagram showing an AC amplifier according to a third embodiment of the present invention.

FIG. 7 is a circuit diagram showing an AC amplifier according to the third embodiment of the present invention. As shown in the drawing, the AC amplifier according to the present embodiment has two wirings Nd1 and Nd2 provided instead of the connecting wiring Nd in the aforementioned second embodiment. That is, an amplification circuit AP2 and a bias circuit VS3 are connected via the two wirings. Here, the wiring Nd1 serves for a bias voltage, and the wiring Nd2 serves for an AC signal. The provision of the wirings Nd1 and Nd2 independently used for the bias voltage and the AC signal can exhibit the same operational advantages as those in the second embodiment. In other words, the ideas of the present invention include a case where the amplification circuit AP1 and the bias circuit VS2 are connected by the two independent wirings Nd1 and Nd2, as well as a case where they are connected by the single connecting wiring Nd. The same holds true for the first embodiment.

In FIG. 7, Cc denotes a coupling capacitor, and Rbo denotes a bias resistance. The same portions as those in FIG. 5 are assigned the same numerals as in FIG. 5, and duplicate explanations are omitted.

Other Embodiments

The power supply voltage VDD can be used instead of the reference voltage sources VB1 and VB2 shown in FIGS. 1, 5 and 7.

In the AC amplifiers of these drawings, a self-biased transistor by the feedback resistor is interchangeable from the n-type MOS transistor to the p-type MOS transistor and vice versa. Accordingly it is necessary that other components such as capacitors Cc1 and Ccb, and the reference voltage source VB1 and VB2, and resistor Rb are reconnected to the equivalent node respectively.

Furthermore, in each of the above-described respective embodiments, the input terminal for the input AC signal is the gate of the NMOS transistor T2. However, this input terminal may be the gate of the PMOS transistor T1, or both gates may be used as the input terminal IN.

APPLICATION EXAMPLE

Figure 8:
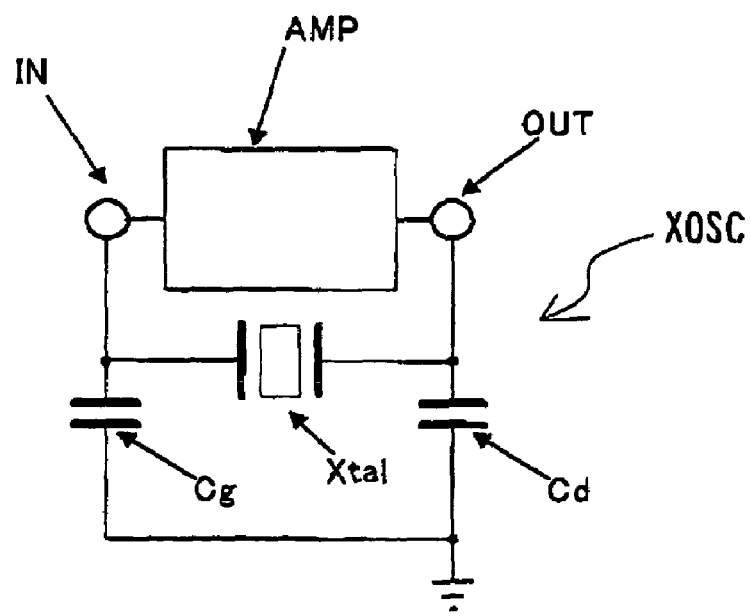
FIG. 8 is a circuit diagram showing a crystal oscillator to which the AC amplifier according to each embodiment of the present invention has been applied.
Figure 9:
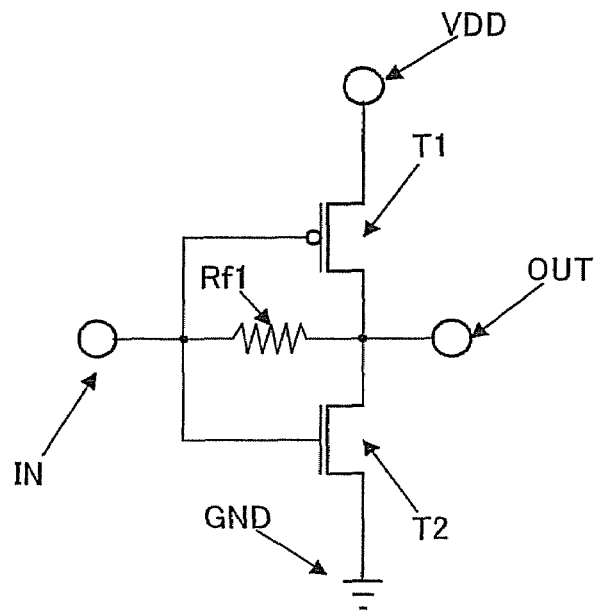
FIG. 9 is a circuit diagram showing an AC amplifier according to an earlier technology.

FIG. 8 is a circuit diagram showing an example in which the AC amplifier (simply referred to as AMP according to each embodiment of the present invention has been applied to a piezoelectric vibrator oscillator, for example, a crystal oscillator XOSC, which is one of the optimal uses. As shown in the drawing, the crystal oscillator XOSC has the same circuit configuration as a publicly known crystal oscillator, except that the AC amplifier AMP according to each embodiment mentioned above is used. With a publicly known crystal oscillator using the conventional CMOS inverting amplifier shown in FIG. 9, a power supplier voltage is required to be higher than the sum of the threshold values of the PMOS transistor T1 and the NMOS transistor T2 in order to ensure amplification characteristics necessary for starting oscillation. Moreover, the operating point B1 of the amplifier is almost unchanged with the oscillation amplitude. Thus, the PMOS transistor T1 and the NMOS transistor T2 constituting the amplifier always remain in Class AB operation. Hence, a large through current flows in the AC amplifier.

In the above-described crystal oscillator XOSC having the AC amplifier AMP according to the embodiment of the present invention, by contrast, a power supply voltage may be less than the sum of the threshold values of the PMOS transistor T1 and the NMOS transistor T2. With such power supply, the AMP acts as an AC amplifier having enough amplification factor A for a small AC signal at the initial stage of oscillation. As the oscillation signal grows, the PMOS transistor T1 and the NMOS transistor T2 both shift from Class A operation to Class AB operation, further to Class B or Class C operation. When oscillation reaches a stable state, therefore, a through current flowing in the AC amplifies can be decreased infinitely. Furthermore, it becomes possible to realize an ideal oscillator, which suppliers a minimum electric power necessary for the crystal vibrator to continue vibration.

As described above, the use of the AC amplifier according to each embodiment of the present invention makes it possible to achieve a crystal oscillator which operates with low voltage less than the sum of the threshold values of both MOS transistors and with an extremely low current consumption, and has a small deviation in the duty of the output signal.

In FIG. 8, Cg and Cd denote coupling capacitances.

The present invention can be utilized in the fields of industries in which electronic equipment such as a crystal oscillator, is manufactured and sold.

The embodiments of the present invention have been described above, but the invention is not limited to these embodiments. It should be understood that the invention can be subject to changes, substitutions or alterations without departing from the spirit and scope of the invention as defined by the appended claims.

What is claimed is:

1. An AC amplifier, comprising:
   an amplification circuit; and
   a bias circuit, wherein
   the bias circuit generates a bias voltage conformed to an amplitude of an AC signal inputted into the amplification circuit, and
   the bias voltage controls an operating point of the amplification circuit, wherein
   the AC signal is inputted into the bias circuit via connecting wiring, and
   the bias voltage generated by the bias circuit is supplied to the amplification circuit via the connecting wiring, and further wherein
   the amplification circuit has a first MOS transistor of a p- or n-type and a second MOS transistor of an n- or p-type having drains interconnected,
   the amplification circuit includes a first feedback resistance connected between the drain and a gate of the second MOS transistor, and a first coupling capacitor connected between a gate of the first MOS transistor and the gate of the second MOS transistor,
   the gate of the first MOS transistor is connected to the connecting wiring,
   the gate of the first or second MOS transistor is used as an input terminal for the signal to be amplified, and
   the interconnected drains of the first MOS transistor and the second MOS transistor are used as an output terminal for the amplified signal.

2. An AC amplifier, comprising:
   an amplification circuit; and
   a bias circuit, wherein
   the bias circuit generates a bias voltage conformed to an amplitude of an AC signal inputted into the amplification circuit, and
   the bias voltage controls an operating point of the amplification circuit, wherein
   the AC signal is inputted into the bias circuit via connecting wiring, and
   the bias voltage generated by the bias circuit is supplied to the amplification circuit via the connecting wiring, and further wherein
   the bias circuit includes a reference voltage source and a nonlinear resistance element interconnected, and
   an end of the nonlinear resistance element is connected to the connecting wiring.

3. The AC amplifier according to claim 1, wherein
   the bias circuit includes a reference voltage source and a nonlinear resistance element interconnected, and
   an end of the nonlinear resistance element is connected to the connecting wiring.

4. The AC amplifier according to claim 2, wherein
   the nonlinear resistance element is connected to a power supply of the AC amplifier, instead of being connected to the reference voltage source, or
   the nonlinear resistance element is grounded without being mediated by the reference voltage source.

5. The AC amplifier according to claim 3, wherein
   the nonlinear resistance element is connected to a power supply of the AC amplifier, instead of being connected to the reference voltage source, or
   the nonlinear resistance element is grounded without being mediated by the reference voltage source.

6. The AC amplifier according to claim 2, wherein the nonlinear resistance element is composed of a MOS transistor.

7. The AC amplifier according to claim 3, wherein the nonlinear resistance element is composed of a MOS transistor.

8. The AC amplifier according to claim 4, wherein the nonlinear resistance element is composed of a MOS transistor.

9. The AC amplifier according to claim 5, wherein the nonlinear resistance element is composed of a MOS transistor.

10. The AC amplifier according to claim 6, wherein the nonlinear resistance element is composed of a depletion MOS transistor.

11. The AC amplifier according to claim 7, wherein the nonlinear resistance element is composed of a depletion MOS transistor.

12. The AC amplifier according to claim 8, wherein the nonlinear resistance element is composed of a depletion MOS transistor.

13. The AC amplifier according to claim 9, wherein the nonlinear resistance element is composed of a depletion MOS transistor.

14. An AC amplifier, comprising:
    an amplification circuit; and
    a bias circuit, wherein
    the bias circuit generates a bias voltage conformed to an amplitude of an AC signal inputted into the amplification circuit, and
    the bias voltage controls an operating point of the amplification circuit, wherein
    the AC signal is inputted into the bias circuit via connecting wiring, and the bias voltage generated by the bias circuit is supplied to the amplification circuit via the connecting wiring, and further wherein the bias circuit includes a third MOS transistor of a p- or n-type and a fourth MOS transistor of an n-or p-type having drains interconnected, a second feedback resistance connected between the drain and a gate of the third MOS transistor, a second coupling capacitor connected between the gate of the third MOS transistor and a gate of the fourth MOS transistor, and a reference voltage source for supplying a DC bias to the gate of the fourth MOS transistor via a bias resistance, and the gate of the third MOS transistor is connected to the connecting wiring.

15. The AC amplifier according to claim 1, wherein the bias circuit includes a third MOS transistor of a p- or n-type and a fourth MOS transistor of an n- or p-type having drains interconnected, a second feedback resistance connected between the drain and a gate of the third MOS transistor, a second coupling capacitor connected between the gate of the third MOS transistor and a gate of the fourth MOS transistor, and a reference voltage source for supplying a DC bias to the gate of the fourth MOS transistor via a bias resistance, and the gate of the third MOS transistor is connected to the connecting wiring.

16. The AC amplifier according to claim 14, wherein the nonlinear resistance element is connected to a power supply of the AC amplifier, instead of being connected to the reference voltage source, or the nonlinear resistance element is grounded without being mediated by the reference voltage source.

17. The AC amplifier according to claim 15, wherein the nonlinear resistance element is connected to a power supply of the AC amplifier, instead of being connected to the reference voltage source, or the nonlinear resistance element is grounded without being mediated by the reference voltage source.

\* \* \* \* \*